US007119642B2

(12) United States Patent
Flores et al.

(10) Patent No.: US 7,119,642 B2
(45) Date of Patent: Oct. 10, 2006

(54) PARALLELED CIRCUIT BREAKER WITH CONDUCTIVE ELEMENTS HAVING THERMALLY STABLE RESISTANCE, AND ASSOCIATED METHOD

(75) Inventors: Jose G. Flores, Mc Allen, TX (US); Salvador Hernandez, Tamaulipas (MX); Craig J. Puhalla, Pittsburgh, PA (US)

(73) Assignee: Eaton Corporation, Cleveland ( * ) Notice: Subject to any disclaimer, the term of this patent is extended or adjusted under 35 U.S.C. 154(b) by 44 days.

(21) Appl. No.: 10/920,749

(22) Filed: Aug. 18, 2004

(65) Prior Publication Data

US 2006/0038448 A1  Feb. 23, 2006

(51) Int. Cl.
*H01H 75/00* (2006.01)
(52) U.S. Cl. .............................. 335/6; 335/8
(58) Field of Classification Search .............. 335/8–10, 335/6; 361/61, 91.2
See application file for complete search history.

(56) References Cited

U.S. PATENT DOCUMENTS 4,584,545 A * 4/1986 Nagel ........................ 335/41
6,064,001 A 5/2000 Ulerich et al.
6,563,406 B1 5/2003 Beatty et al.

* cited by examiner

*Primary Examiner*—Ramon M. Barrera
(74) *Attorney, Agent, or Firm*—Martin J. Moran

(57) ABSTRACT

An improved paralleled multiple pole circuit breaker employs a conductive element of known resistance connected in series within each pole. A bridging conductor electrically connects together the poles and balances the current flow therethrough at a location between the sets of separable contacts and the conductive element of each pole. The conductive elements are mass-produced plate-like blades of a material having a resistance that is substantially fixed and is substantially independent of temperature. During operation, the voltage drop across one of the conductive elements can be determined by directly measuring the voltage drop between the ends of the conductive element without additionally interposing copper, solder, or other materials between the locations on the conductive element across which the voltage drop is determined.

19 Claims, 2 Drawing Sheets

PARALLELED CIRCUIT BREAKER WITH CONDUCTIVE ELEMENTS HAVING THERMALLY STABLE RESISTANCE, AND ASSOCIATED METHOD

BACKGROUND OF THE INVENTION

1. Field of the Invention

The present invention relates generally to circuit breakers and, more particularly, to a paralleled circuit breaker and an associated method.

2. Description of the Related Art

Electrical switching apparatus for electric power distribution systems includes circuit breakers and network protectors which provide protection, and further includes electrical switches for isolating parts of the distribution system and for selecting from among alternate sources. While families of such switches are produced having a range of current ratings, some applications require higher current ratings than are available from the standard units. It is not practical to make a dedicated switch for such applications in view of the limited demand. It is therefore common to mount a pair of such switches side-by-side and to connect together the poles to share the current. It is similarly common to provide a multiple pole circuit breaker and to connect together in parallel the poles thereof to similarly share the current. Such a parallel construction technique is of particular value with molded case switches and breakers where the required investment in the molded case is quite large, and the need can be alleviated by joining together multiple circuit breakers or by combining together multiple poles of a multiple pole circuit breaker.

Such paralleled circuit breakers typically have an operating mechanism that seeks to simultaneously separate during certain specified conditions the separable contacts of each of the poles of the circuit breaker to interrupt current flowing through the poles. Such operating mechanisms typically are unable to separate all of the sets of separable contacts in a precisely simultaneously fashion. More particularly, it is usually the case that the separable contacts of one particular pole of a multiple pole circuit breaker are invariably the last contacts to be separated by the operating mechanism, and the time lag after which the separable contacts of the particular pole separate may be only a fraction of a second. Such a time lag can result from numerous factors, including manufacturing tolerances and imprecision, wear, and other factors. In all such situations, a time lag may exist between the separation of any of the sets of contacts and any of one or more other sets of contacts.

In a situation in which multiple poles of a circuit breaker are connected together in parallel, and during the time lag while cycling the operating mechanism in which fewer than all of the sets of separable contacts have been separated, all of the current that had been flowing through the multiple poles seeks to travel through those poles whose separable contacts are still connected together. When each successive set of separable contacts actually separate, an electrical arc larger than any of the preceding arcs are formed across the separating contact. Such successively larger arcs have the effect of degrading to a successively greater extent the contacts of the later-opening poles due to vaporization of the material of the contacts and other factors. Such degradation of the contacts of any given pole reduces the amount of current that can be carried to the pole, such that once the circuit breaker is returned to operation, the poles have an unequal current carrying capability, with the result that greater amounts of current travel through some of the poles than through others.

Such unevenness in current carrying capability complicates the measurement of the current flowing through the paralleled breaker at any given time. Various systems have been proposed to enable the determination of current flow in such a situation.

One such proposed system includes providing a plate of conductive material having a thermally stable resistance and soldering the plate between a pair of elongated copper bridging elements. The plate can be made of a material such as manganin, for example, which has a resistance that is substantially fixed and is substantially independent of temperature. One of the copper bridging elements is employed to electrically bridge together all of the poles at the load side of the sets of separable contacts. All of the current flowing through the breaker flows through the plate and is redistributed with the other copper bridging element to the various poles for transmission through trip units of the poles and the like, and ultimately to a load terminal.

During operation of such a circuit breaker, the current flow through the breaker can be roughly determined by measuring the voltage drop between the copper bridging elements. Based upon such voltage drop and the known resistance of the plate, the current flowing through the breaker can be roughly determined. Such systems have not, however, been without limitation.

While the aforementioned plate itself has a substantially fixed resistance that is substantially independent of temperature, the solder and the copper bridging elements are of a resistance that is not as thermally stable as that of the plate. Such systems therefore have been able to provide only a somewhat stable resistance, with consequent inaccuracy in the determination of current flow. Moreover, the use of a single plate between the copper bridging elements typically concentrates in the vicinity of the plate the generation of heat. Such heat concentration leads to additional variations in the temperature of the solder and the copper bridging elements. This leads to further inaccuracy in current flow determination, as well as a concentration of heat generation, both of which are undesirable. Such systems are additionally undesirable since the copper bridging elements, solder, and conductive plate often must be assembled together by hand and also be manually calibrated, all of which add substantial expense to such systems. Such systems are additionally undesirable since the soldered connections can fail during short circuit and other high current events.

It thus would be desired to provide an improved paralleled circuit breaker that alleviates the problems of concentrated heat generation, inaccurate current determinations, and limited ability to handle high current events. Such an improved circuit breaker might also advantageously be less expensive to manufacture than previously known breakers.

SUMMARY OF THE INVENTION

An improved paralleled multiple pole circuit breaker employs a conductive element of known resistance connected in series within each pole. A bridging conductor electrically connects together the poles and balances the current flow therethrough at a location between the sets of separable contacts and the conductive element of each pole. The conductive elements are mass-produced plate-like blades of a material having a resistance that is substantially fixed and is substantially independent of temperature. During operation, the voltage drop across one of the conductive elements can be determined by directly measuring the voltage drop between the ends of the conductive element without additionally interposing copper, solder, or other materials between the locations on the conductive element across which the voltage drop is determined.

Accordingly, an aspect of the invention is to provide an improved paralleled circuit breaker on which the current flow therethrough can be readily determined.

Another aspect of the invention is to provide an improved paralleled circuit breaker that alleviates the concentration of heat generation associated with a single plate of conductive material soldered between elongated bridging elements.

Another aspect of the invention is to provide an improved paralleled circuit breaker than can be manufactured relatively less expensively than previously known breakers because the need for a custom manufactured component that includes a conductive plate soldered between a pair of elongated bridging elements, and consequent working thereof to achieve a desired calibrated resistance, has been alleviated.

Another aspect of the invention is to provide an improved paralleled circuit breaker having on each pole a conductive element of a known resistance, the conductive elements being mass produced such as by stamping or other such manufacturing process, with the conductive elements being employed to distribute the heat generated from current flowing through the conductive elements and to enable the accurate determination of current flowing through the breaker during operation thereof.

Another aspect of the invention is to provide an improved method of determining current flow in a paralleled circuit breaker.

Accordingly, an aspect of the invention is to provide an improved method of determining a current flow in a circuit breaker having a plurality of poles electrically connected together in parallel, each pole having a set of separable contacts, in which the general nature of the method can be stated as including providing a conductive element on each pole, each conductive element having a first end and a second end, the conductive element having a known resistance between the first end and the second end, the first ends being disposed electrically adjacent the contacts, bridging together the first ends of the conductive elements with a first bridging conductor, determining on one of the conductive elements a voltage drop directly between the first end and the second end thereof, and determining the current flow from the known resistance and the voltage drop.

Another aspect of the invention is to provide an improved parallel pole circuit breaker, in which the general nature of the circuit can be stated as including a first terminal, a second terminal, and a plurality of poles electrically connected in parallel between the first terminal and the second terminal, each pole comprising a set of separable contacts and a conductive element having a predetermined resistance substantially independent of temperature, the conductive element having a first end and a second end and being electrically connected in series between the set of separable contacts and one of the first terminal and the second terminal, the first end being disposed electrically adjacent the set of separable contacts, a paralleling apparatus comprising a first bridging conductor electrically connecting together the first ends of the conductive elements, and means for enabling a determination of a voltage drop directly between the first end and the second end of one of the conductive elements.

BRIEF DESCRIPTION OF THE DRAWINGS

A further understanding of the invention can be gained from the following Description of the Preferred Embodiments when read in conjunction with the accompanying drawings in which.

Similar numerals refer to similar parts through the specification.

DESCRIPTION OF THE PREFERRED EMBODIMENTS

Figure 1:
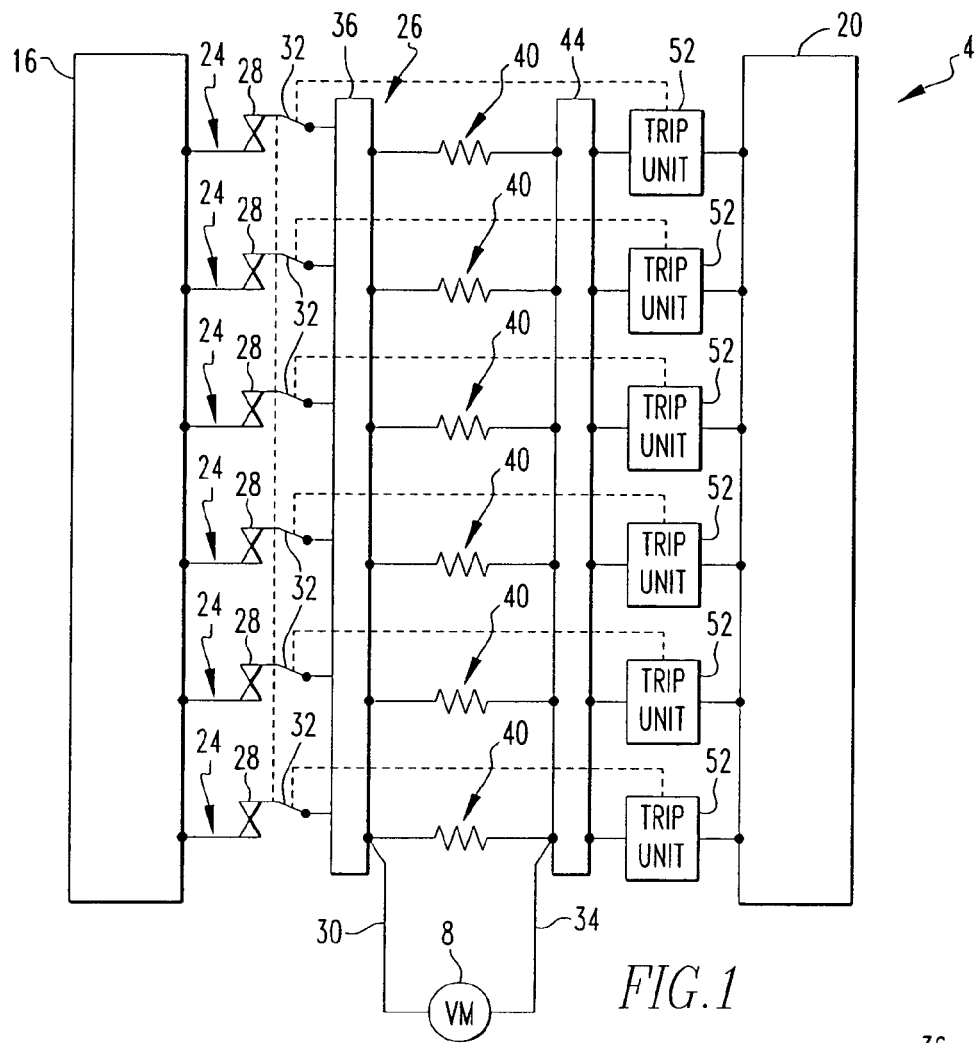
FIG. 1 is a schematic depiction of an improved circuit breaker in accordance with a first embodiment of the invention.
Figure 2:
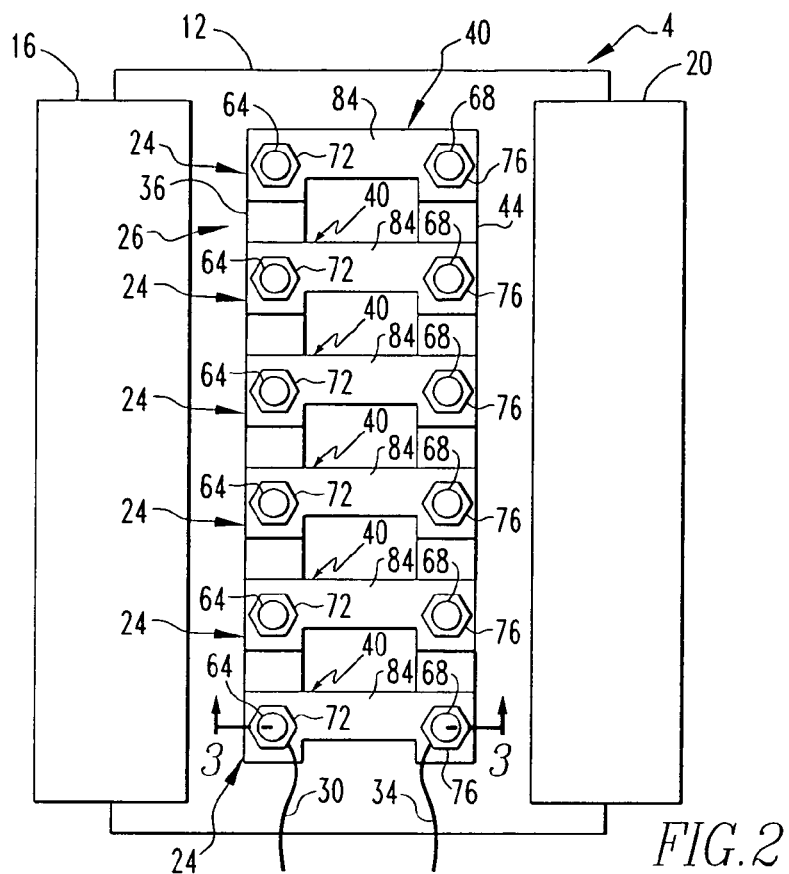
FIG. 2 is a view of a portion of an exterior of the circuit breaker of FIG. 1.
Figure 3:
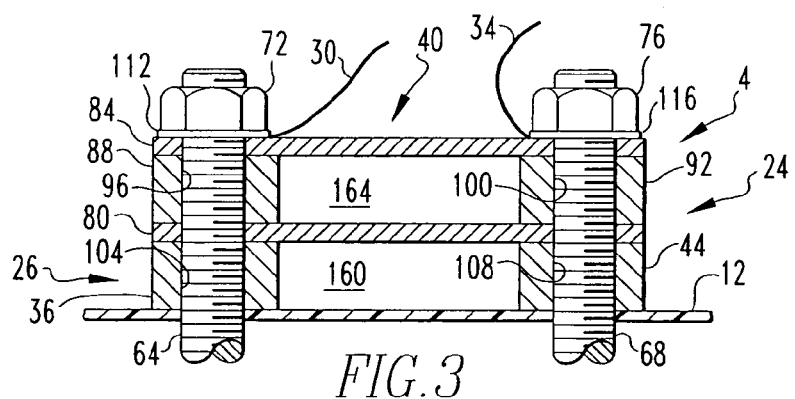
FIG. 3 is a sectional view as taken along Line 3—3 of FIG. 2.

An improved paralleled circuit breaker 4 in accordance with the invention is indicated schematically in FIG. 1, and is also depicted in FIGS. 2 and 3. The breaker 4 is advantageously configured to allow relatively accurate determination of current flow during operation of the breaker 4, to be capable of less expensive manufacture than previous circuit breakers, and to reduce the concentration of heat generation by distributing the generation of heat to numerous locations on the breaker 4. The breaker 4 is depicted in FIG. 1 as being connected with a sensing device 8 which, for example, can be a voltmeter. The breaker 4 is depicted in FIG. 2 as being unconnected with any such sensing device but as being capable of such connection.

As can be understood from FIGS. 1 and 2, the breaker 4 includes a case 12, a line terminal 16, a load terminal 20, and a plurality of poles 24, with the poles 24 being connected in parallel between the line terminal 16 and the load terminal 20. The breaker 4 additionally includes a paralleling apparatus 26 that bridges the poles 24 together intermediate the line terminal 16 and the load terminal 20, and further includes a first lead 30 and a second lead 34. The first and second leads 30 and 34 are provided to enable the breaker 4 to be connected with the sensing device 8 such as is depicted generally in FIG. 1.

Each pole 24 includes a pair of contacts 28 that are separable in certain circumstances, with one of the contacts of the pair of contacts 28 being disposed on a movable arm 32. The aforementioned paralleling apparatus 26 includes a first bridging conductor 36 that bridges together the poles 24 on the load side of the pair of contact 28.

Each pole 24 additionally includes a conductive element 40 of a known resistance that is connected in series within its respective pole 24. In the depicted exemplary embodiment of FIG. 1, the conductive elements 40 are electrically connected with the first bridging conductor 36. Moreover, in the depicted exemplary embodiment the paralleling apparatus 26 additionally includes a second bridging conductor 44 that electrically connects together the conductive elements 40 at the load side thereof. In other embodiments, the breaker can be operated without providing the second bridging conductor 44 without departing from the concept of the invention.

Each pole 24 additionally includes a trip unit 52. The trip unit 52 of any given pole 24 is operatively connected with the movable arm 32 of the same pole 24 in order to enable separation of the pair of contacts 28 of that pole 24 in certain predetermined circumstances. The movable arms 32 are depicted in FIG. 1 as being operatively connected together, and such feature is provided by a tripping bar or other system which, when it is determined that a movable arm 32 is being pivoted during a tripping event, will cause the other movable arms 32 of the other poles 24 to similarly move and separate the contacts 28 thereof.

As can be understood from FIGS. 2 and 3, each pole 24 of the breaker 4 includes a first connector 64 and a second connector 68 that extend outwardly from a portion of the case 12. The conductive element 40 of any given pole 24 is electrically connected between the first and second connectors 64 and 68 of the pole 24 in order to electrically connect the conductive element 40 in series within the pole 24. A first fastener 72 is cooperable with the first connector 64, and a second fastener 76 is cooperable with the second connector 68 to provide a secure electrical connection between the conductive element 40 and the first and second connectors 64 and 68. In the depicted exemplary embodiment, the first and second connectors 64 and 68 are threaded studs, and the first and second fasteners 72 and 76 are threaded nuts that are threadably cooperable with the first and second connectors 64 and 68, although it is understood that other types of connectors and/or fasteners can be employed without departing from the concept of the invention.

Figure 4B:
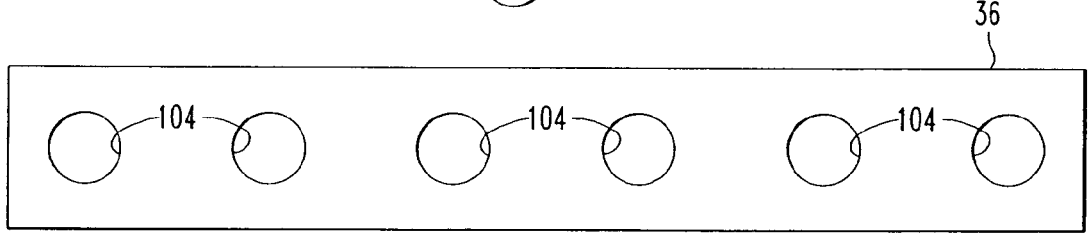
FIG. 4B is a top plan view of another portion of the circuit breaker of FIG. 2.
Figure 4A:
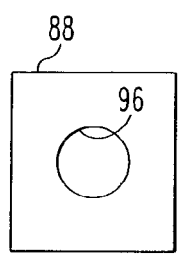
FIG. 4A is a top plan view of another portion of the circuit breaker of FIG. 2.

As indicated above, the conductive element 40 of each pole 24 is of a known resistance that is substantially fixed and is substantially independent of temperature. As can be understood from FIGS. 2 and 3, each exemplary conductive element 40 of the breaker 4 of the first embodiment includes a pair of plate-like conductive blades 80 and 84, a first spacer 88, and a second spacer 92. The conductive blades 80, 84 are mass produced, such as by stamping out of a large sheet of material, and are substantially identical to one another. The first and second spacers 88 (FIG. 4A) and 92 are rectangular conductive members that space apart the conductive blades 80 and 84 and that are substantially identical to one another. The first spacer 88 includes a first spacer hole 96 formed therein, and the second spacer 92 includes a second spacer hole 100 formed therein. The first and second spacer holes 96 and 100 are sized to receive the first and second connectors 64 and 68, respectively, therethrough when the conductive element 40 is mounted to the first and second connectors 64 and 68.

The first bridging conductor 36 (FIG. 4B) is an elongated conductive member that includes a plurality of spaced first bridging conductor holes 104 formed therein. The first bridging conductor holes 104 are sized to receive the first connectors 64 of the poles 24 therein. The second bridging conductor 44 is similarly an elongated conductor and includes a plurality of second bridging conductor holes 108 formed therein that are sized to receive the second connectors 68 therethrough.

Figure 4:
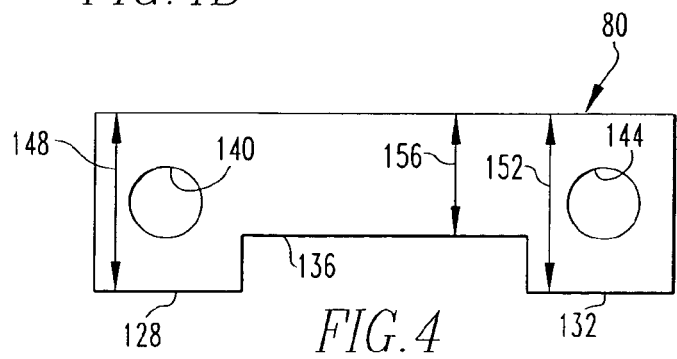
FIG. 4 is a top plan view of a portion of the circuit breaker of FIG. 2.

The conductive blade 80, with which the conductive blade 84 is substantially identical, is depicted generally in FIG. 4. The conductive blade 80 is a monolithically formed single-piece member having a common thickness, such as if the conductive blade 80 were formed out of a relatively larger plate of material such as by stamping or other appropriate forming operation. Other configurations of the conductive blade 80 are possible without departing from the concept of the invention. The present exemplary conductive blade 80 includes a first end portion 128, a second end portion 132, and a connecting portion 136 disposed between the first and second end portions 128 and 132. The first end of portion 128 includes a first hole 140 formed therein that is sized to receive the first connector 68 therein. Similarly, the second end portion 132 includes a second hole 144 formed therein that is sized to receive the second connector 68 therein.

As can be best understood from FIGS. 2 and 3, when the conductive element 40 of each pole 24 is mounted to the first and second connectors 64 and 68 of the pole 24, the conductive blades 80 and 84 are electrically connected together in parallel and are spaced apart from one another and spaced from the case 12. For example, the first bridging conductor 36 can be received against the case 12, with the first connectors 64 of the poles 24 being received through the first bridging conductor holes 104. Similarly, the second bridging conductor 44 can be received against the case 12, with the second connectors 68 being received through the second bridging conductor holes 108. The conductive blade 80 of each pole 24 is electrically connected with and disposed adjacent the first and second bridging conductors 36 and 44, with the first connector 64 being received through the first hole 140, and with the second connector 68 being received through the second hole 144. The first and second spacers 88 and 92 are interposed between the conductive blades 80 and 84, with the first connector 64 being received through the first spacer hole 96, and with the second connector 68 being received through the second spacer hole 100. The first and second fasteners 72 and 76 are then cooperated with the first and second connectors 64 and 68, respectively, to secure the conductive blades 80 and 84, the first and second spacers 88 and 92, and the first and second bridging conductors 36 and 44 together on the case 12.

On one of the poles 24, specifically the pole 24 depicted in section in FIG. 3, includes a first lug 112 on the first connector 64, and a second lug 116 on the second connector 68, with the first lug 112 being interposed between the conductive blade 84 and the first fastener 72, and with the second lug 116 being interposed between the conductive blade 84 and the second fastener 76. The first lead 30 is electrically connected with and extends from the first lug 112, and the second lead 34 is electrically connected with and extends from the second lug 116.

As mentioned above, the first and second leads 30 and 34 can be connected with the sensing device 8 which, for example, may be a voltmeter or other device, in order to determine the voltage drop directly between the first and second ends of the conductive blade 84. In this regard, the aforementioned first end and second end of the conductive blade 84 will generally be considered to be the periphery of the first and second holes 140 and 144 formed in the conductive blade 84 generally at the point where the first and second lugs 112 and 116 are connected with the conductive blade 84. The resistance of the conductive blade 84, such as could be measured between the first and second ends thereof by the first and second leads 30 and 34, is substantially fixed and is substantially independent of the temperature of the conductive blade 84. By knowing the resistance of the conductive blade 84 between the first and second ends, a measurement of the voltage drop across the conductive blade 84 between the first and second ends will enable a direct determination of the current flowing through the conductive blade 84. By providing the first bridging conductor 36, the conductive blades 80 and 84 of each of the poles 24 will be carrying virtually identical amounts of current. The configuration of the conductive elements 40 thus enables one to relatively accurately determine the current flow through the breaker 4. In the present example, the breaker 4 is a DC breaker, although the breaker 4 potentially could be used in AC applications without departing from the concept of the invention.

As can be seen in FIG. 3, the spacing of the conductive blade 80 from the case 12 provides a first open region 160 between the case 12 and the connecting portion 136 of the conductive blade 80, and the spacing of the conductive blades 80 and 84 apart from one another with the use of the first and second spacers 88 and 92 provide a second open region 164 between the connecting portions 136 of the conductive blades 80 and 84. The first and second open regions 160 and 164 facilitate convective heat transfer between the conductive blades 80 and 84 of each pole 24 and the surrounding air, which is desirable.

As can be seen in FIG. 4, the first end portion 128 is of a first transverse dimension 148, the second end portion 132 is of a second transverse dimension 152, and the connecting portion 136 is of a third transverse dimension 156. In the depicted embodiment of the conductive blade 80, the first and second transverse dimensions 148 and 152 are equal, and the third transverse dimension 156 is different, i.e., smaller, than the first and second transverse dimensions 148 and 152. The third transverse dimension 156, as well as the first and second transverse dimensions 148 and 152, can be configured to provide the conductive blades 80 with a desirable resistance. For instance, the resistance of each conductive blade 80 between the first and second ends thereof may be, for example, 250 $\mu\Omega$, although the resistance of the conductive blades 80 can be tailored by specifically configuring the conductive blades 80 to provide such resistance.

The conductive blades 80 are mass produced, such as by a stamping or other forming operation, and are of a plate-like configuration. By mass producing the conductive blades 80, the cost per blade is relatively small. By enabling the mass produced conductive blades 80 to be assembled to the breaker 4 without the need for specialized hand working, such as filing and the like to achieve a particular calibrated resistance, the assembly cost of the breaker 4 is less than would otherwise be the case if hand working of the conductive blades 80 were required.

As mentioned above, the conductive blades 80 can be formed of a conductive material having a resistance that is substantially fixed and is substantially independent of temperature within an anticipated working range of the breaker 4, such as manganin. It is understood, however, that other materials may be employed without departing from the concept of the invention. The first and second bridging conductors 36 and 44, and the first and second spacers 88 and 92, may be formed of copper or other appropriate conductive material. Since the resistance of the conductive blades 84 between the first and second ends is known, and since the voltage drop along the conductive blade 84 is directly measured between the first and second ends, the copper that may be in the first and second bridging conductors 36 and 44 and the first and second spacers 88 and 92 has at most an extremely minimal effect on the ability of the current flow in the breaker 4 to be determined.

Figure 5:
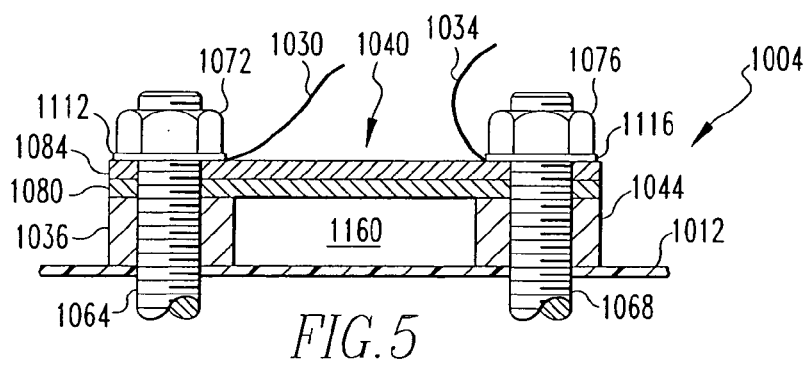
FIG. 5 is a view similar to FIG. 3, except depicting another circuit breaker in accordance with a second embodiment of the invention.

A second embodiment of an improved paralleled circuit breaker 1004 is depicted in section in FIG. 5. The breaker 1004 is similar to the breaker 4, except that the breaker 4 includes the first and second spacers 88 and 92, while the breaker 1004 does not.

Specifically, the breaker 1004 includes a conductive element 1040 on each pole thereof, and the conductive element 1040 is of a known resistance that is substantially fixed and substantially independent of temperature. The conductive element 1040 includes a conductive blade 1080 and a conductive blade 1084 that are disposed adjacent one another and are mounted to the first and second connectors 1064 and 1068 with the first and second fasteners 1072 and 1076. The breaker 1004 includes the first bridging conductor 1036 connecting together the first connectors 1064 and disposed against the case 1012, and further includes the second bridging conductor 1044 connecting together the second connectors 1068 and being disposed against the case 1012. The conductive blade 1080 is disposed adjacent the first and second bridging conductors 1036 and 1034. The first and bridging conductors 1036 and 1044 space the conductive blade 1080 away from the case 1012 to provide the open region 1160, which promotes desirable convective heat transfer.

The pole of the breaker 1004 depicted in FIG. 5 includes the first and second leads 1030 and 1034 connected by the first and second lugs 1112 and 1116 to the first and second connectors 1064 and 1068, respectively, to enable the voltage drop between the first and second ends of the conductive blade 1084 to be directly measured in order to enable a determination of current flow through the breaker 1004. The other poles of the breaker 4 typically would not include the first and second leads 1030 and 1034 or the first and second lugs 1112 and 1116.

As suggested above, alternate embodiments of the breaker 4 could be provided without the second bridging conductor 44. For instance, the second bridging conductor 44 might be replaced with a number of spacers of substantially the same thickness as the first bridging conductor 36 to provide the first open region 160. Alternatively, or in addition thereto, the breaker 4 may be configured without the conductive blade 84, and rather may be configured to provide only the single conductive blade 80 extending between the first and second connectors 64 and 68. Either such configuration could be provided with or without the first and second spacers 88 and 92. Any of the foregoing configurations can be selected depending upon various factors such as cost, current rating, and numerous other factors. It is additionally noted that in other applications involving the use of about five or more of the blades 80 and 84 on each of the poles 24, it has been observed that more current may flow through the blades 80 and 84 that are disposed relatively closer to the case 12 than the other blades 80 and 84 spaced relatively farther from the case. It has been determined, however, that the flow of current through the blades 80 and 84 of a given pole 24 can be balanced to a relatively greater degree by plating one or more of the blades 80 and 84 with a conductor such as silver or other such conductor. It is also noted that the breaker 4 can be configured with fewer than all of the blades 80 and 84 being made of manganin, such as if some of the blades 80 and 84 were formed of, for instance, copper or another conductor, depending upon the competing considerations of cost, accuracy of current flow determination, and other considerations.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of determining a current flow in a circuit breaker having a plurality of poles electrically connected together in parallel, each pole having a set of separable contacts, the method comprising:

providing a conductive element on each pole, each conductive element having a first end and a second end, the conductive element having a known resistance between the first end and the second end, the first ends being disposed electrically adjacent the contacts;

bridging together the first ends of the conductive elements with a first bridging conductor;

determining on one of the conductive elements a voltage drop directly between the first end and the second end thereof;

determining the current flow from the known resistance and the voltage drop; and bridging together the second ends of the conductive elements with a second bridging conductor.

2. The method of claim 1 wherein said providing a conductive element on each pole further comprises providing on each pole a conductive element having a substantially fixed resistance that is substantially independent of temperature.

3. The method of claim 1 wherein said providing a conductive element on each pole further comprises providing a conductive element on each pole electrically in series with the set of separable contacts of the pole.

4. The method of claim 3 wherein said providing a conductive element on each pole further comprises providing on each pole a conductive element having at least a first blade.

5. The method of claim 4 wherein said providing a conductive element on each pole further comprises providing on each pole a second blade disposed adjacent the at least first blade.

6. The method of claim 4 wherein said providing a conductive element on each pole further comprises providing on each pole a second blade and a spacer, the spacer being disposed between the at least first blade and the second blade to space apart the at least first blade and the second blade, the at least first blade and the second blade being electrically connected together in parallel.

7. The method of claim 4 wherein said providing on each pole a conductive element having at least a first blade further comprises providing on each pole at least a first blade that is a monolithically formed single-piece member.

8. The method of claim 1 wherein said determining on one of the conductive elements a voltage drop further comprises determining the voltage drop from a shunt electrically connected between the first end and the second end of the one of the conductive elements.

9. A parallel pole circuit breaker comprising:
a first terminal;
a second terminal;
a plurality of poles electrically connected in parallel between the first terminal and the second terminal;
each pole comprising a set of separable contacts and a conductive element having a predetermined resistance substantially independent of temperature, the conductive element having a first end and a second end and being electrically connected in series between the set of separable contacts and one of the first terminal and the second terminal, the first end being disposed electrically adjacent the set of separable contacts;
a paralleling apparatus comprising a first bridging conductor electrically connecting together the first ends of the conductive elements; and
means for enabling a determination of a voltage drop directly between the first end and the second end of one of the conductive elements;
each conductive element comprising at least first blade that comprises a first end portion a second end portion and a connecting portion extending between the first and second end portions, the first end portion, the second end portion, and the connecting portion together being of a common thickness, the first and second end portions each having a transverse dimension of a first size, the connecting portion having a transverse dimension of a second size different than the first size.

10. A parallel pole circuit breaker comprising:
a first terminal;
a second terminal;
a plurality of poles electrically connected in parallel between the first terminal and the second terminal;
each pole comprising a set of separable contacts and a conductive element having a predetermined resistance substantially independent of temperature, the conductive element having a first end and a second end and being electrically connected in series between the set of separable contacts and one of the first terminal and the second terminal, the first end being disposed electrically adjacent the set of separable contacts;
a paralleling apparatus comprising a first bridging conductor electrically connecting together the first ends of the conductive elements;
means for enabling a determination of a voltage drop directly between the first end and the second end of one of the conductive elements;
each conductive element comprising at least a first blade;
each pole further comprising a pair of connectors, the conductive element of each pole being electrically connected between the pair of connectors of the pole;
the at least first blade being a monolithically formed single-piece member; and
wherein the at least first blade comprises a first end portion, a second end portion, and a connecting portion extending between the first and second end portions, the first end portion, the second end portion, and the connecting portion together being of a common thickness, the first and second end portions each having a transverse dimension of a first size, the connecting portion having a transverse dimension of a second size different than the first size.

11. The circuit breaker of claim 10 wherein the first and second end portions each have a hole formed therein sized to accommodate one of the connectors.

12. A parallel pole circuit breaker comprising:
a first terminal;
a second terminal;
a plurality of poles electrically connected in parallel between the first terminal and the second terminal;
each pole comprising a set of separable contacts and a conductive element having a predetermined resistance substantially independent of temperature, the conductive element having a first end and a second end and being electrically connected in series between the set of separable contacts and one of the first terminal and the second terminal, the first end being disposed electrically adjacent the set of separable contacts;

a paralleling apparatus comprising a first bridging conductor electrically connecting together the first ends of the conductive elements;

means for enabling a determination of a voltage drop directly between the first end and the second end of one of the conductive elements; and wherein the paralleling apparatus further comprises a second bridging conductor electrically connecting together the second ends of the conductive elements.

13. The circuit breaker of claim 12 wherein each conductive element comprises at least a first blade.

14. The circuit breaker of claim 13 wherein each conductive element further comprises a second blade disposed adjacent the at least first blade.

15. The circuit breaker of claim 13 wherein each conductive element further comprises a second blade and a spacer, the spacer being disposed between the at least first blade and the second blade to space apart the at least first blade and the second blade.

16. The circuit breaker of claim 13 wherein each pole further comprises a pair of connectors, the conductive element of each pole being electrically connected between the pair of connectors of the pole.

17. The circuit breaker of claim 16 wherein the at least first blade is a monolithically formed single-piece member.

18. The circuit breaker of claim 12 wherein the means for enabling a determination of a voltage drop comprises a first lead extending from the first end of one of the conductive elements and a second lead extending from the second end of said one of the conductive elements, the first and second leads being connectable with a detection device.

19. The circuit breaker of claim 18 wherein the first and second leads are connectable.

* * * * *